United States Patent [19]

Brogårdh et al.

[11] 4,356,448

[45] Oct. 26, 1982

[54] APPARATUS FOR MEASURING ELECTRICAL OR MAGNETIC FIELDS BY ABSORPTION SPECTRUM CHANGE

[75] Inventors: Torgny Brogårdh; Olof Engström, both of Västerås, Sweden

[73] Assignee: ASEA Aktiebolag, Västerås, Sweden

[21] Appl. No.: 152,724

[22] Filed: May 23, 1980

[30] Foreign Application Priority Data

May 31, 1979 [SE] Sweden ............................... 7904752

[51] Int. Cl.$^3$ ...................... G01R 31/00; G01R 33/02
[52] U.S. Cl. ................................... 324/244; 324/252; 324/96; 250/231 R
[58] Field of Search .................. 324/96, 244, 252, 260; 250/231 R; 350/355

[56] References Cited

U.S. PATENT DOCUMENTS

| | | | |
|---|---|---|---|
| 3,583,788 | 6/1971 | Lee et al. | 350/355 |
| 3,662,263 | 5/1972 | Bensel | 324/96 |
| 3,991,383 | 11/1976 | Hughes | 350/355 |
| 4,147,979 | 4/1979 | Baues et al. | 324/96 X |
| 4,270,050 | 5/1981 | Brogårdh | 356/32 |

FOREIGN PATENT DOCUMENTS

| | | |
|---|---|---|
| 1522324 | 4/1968 | France . |
| 2170128 | 9/1973 | France . |
| 2308105 | 11/1976 | France . |

*Primary Examiner*—F. L. Evans
*Attorney, Agent, or Firm*—Watson, Cole, et al.

[57] ABSTRACT

A fiber optical measuring device for measuring a magnetic or electric field comprises an optical modulator influenced by the field. The optical properties of the modulator are dependent on the magnetic or electric field acting on the modulator. The optical property which is made use of is the field dependence of at least one absorption edge of the radiation absorption spectrum of the modulator material. Optical fibers may be used for feeding light into the modulator and for leading away light that has passed through the modulator.

25 Claims, 21 Drawing Figures

APPARATUS FOR MEASURING ELECTRICAL OR MAGNETIC FIELDS BY ABSORPTION SPECTRUM CHANGE

TECHNICAL FIELD

This invention relates to a fiber optical measuring device for measuring magnetic and electric fields, based on spectral analysis.

BACKGROUND ART

It is known to use an optical measuring device for measuring electric magnitudes by using the magnitude to be measured for moving a mechanical system in space, the position of said system being sensed optically with the aid of light transmitted along an optical fiber. A screen or the like is arranged to move with the mechanical system and effect a partial screening of a ray of light directed towards the screen. The screened part of the light ray is dependent on the position of the mechanical system. A sensing and evaluation of the screened part of the light ray are used for evaluating the magnitude that has brought about the movement of the screen.

The geometric-optical construction of a measuring device of the kind just described has, among other things, the disadvantages of a low upper limiting frequency, sensitivity to vibrations and hysteresis because of friction in the mechanical system. The present invention aims to provide an optical measuring device for measuring magnetic and electric fields which does not have these disadvantages.

DISCLOSURE OF INVENTION

According to the invention an optical measuring device for measuring a magnetic or electric field comprises at least one radiation modulator which consists of a material, the spectral properties of which are dependent on the said field, and means for measuring said spectral properties with the aid of radiation in a given wavelength range which is made to pass through said modulator, said modulator, in said given wavelength range, being constructed such that the application of said field causes a modification of at least one adsorption edge in the adsorption spectrum of said material. The alteration of the absorption spectrum with respect to the spectrum of the radiation used is therefore a measure of the field to be measured. A device according to the invention is of great value for current and voltage measurements, for field strength measurements, as a limit position transducer or as a speed transducer.

Desirably, the device includes at least one source of light having an emission spectrum which overlaps the said absorption edge. An optical fiber can be used to feed light to and from the modulator.

Preferably the material of the modulator has a specific resistivity which is at least that of a semiconductor material.

Suitably, Ge, GeAs, GaP or AlAs, or some other element of Group IV, or some other compound of elements in Groups II and VI or Groups III and V of the Periodic Table of Elements is employed for the modulator material.

BRIEF DESCRIPTION OF DRAWINGS

The invention will now be described, by way of example, with reference to the accompanying drawings, in which.

DESCRIPTION OF PREFERRED EMBODIMENTS

The basic principle of the measuring devices described is that they comprise one or more optical modulators which are influenced by an electric and/or a magnetic field. The optical modulation is brought about by the field in question influencing the energy levels of electrons in the modulator, with the result that its absorption spectrum is changed. Primarily, modulators of semiconductor material are used since the band gap of these correspond to the photon energy of light sources which, in the present situation, give the best performance in such devices, that is, light-emitting diodes and semiconductor lasers. When it comes to magnetic fields, the absorption spectrum is primarily influenced through the so-called Landau levels. These involve a modulation of the electron state density, which have the effect of giving rise to new energy levels. For electric fields, the Franz-Keldysh effect is primarily utilized, which means that the wave functions for both holes and electrons in a semiconductor in an electric field get a mathematical and physical solution in the band gap, so that the band gap becomes narrower. This will displace the absorption edge towards lower energies when an electric field is applied to the modulator. To acquire a good sensitivity to changes in the electric field, the resistivity of the modulator should be chosen as high as possible, and particularly suitable materials are therefore GaAs and GaP. In the following description of the drawings, it is assumed that it is an electric field which is influencing the spectral properties of the modulator, but the principles described are also applicable to a magnetic field.

Figure 1:
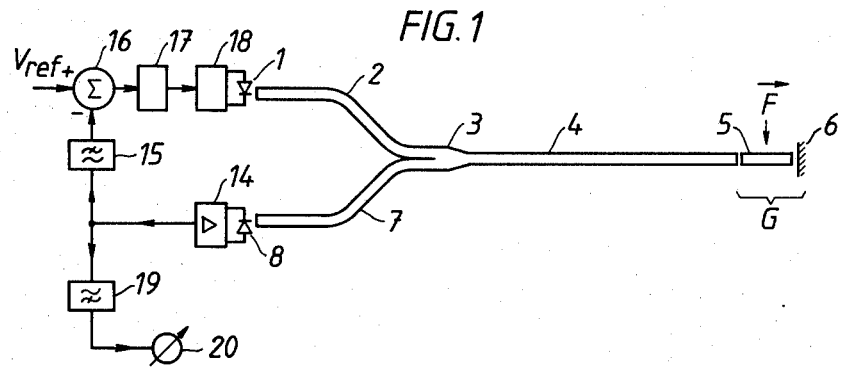
FIG. 1 shows in purely schematic form a measuring device according to the invention for dynamic measurements.

FIG. 1 shows a fiber optical transducer, in which the light absorption of an optical modulator 5 is detected by means of a fibre 4. Light from a light emitting diode (LED) 1 is transmitted via an optical fiber 2, a fiber branch 3 and a fiber 4 to the optical modulator 5. Beyond the modulator there is a reflecting surface 6. The light that has passed through the modulator 5, that has been reflected by the surface 6, that has again passed through the modulator 5 and that has re-entered the fiber 4, is led by the fiber 4 to the branch 3, from which part of the reflected light is led into a fiber 7. The electric field F influences the absorption spectrum of the modulator material, permitting changes in light transmission through the modulator 5 to be calibrated to the variations in the field F. The light emerging from the fiber 7 is detected by a photon-detector 8, the photo-current of which is amplified in an amplifier 14. The output signal from the amplifier 14 passes through a low-pass filter 15 and the output signal from the filter is compared in a subtraction device 16 with a reference signal $V_{ref}$. The error signal thus obtained controls a regulator 17, which in turn controls a drive circuit 18 for the LED 1 in such a way that the output signal of the filter 15 is maintained equal to $V_{ref}$. In this way, the electronics system compensates for instabilities of the LED, the fibers and the photon-detector 8. The output signal from the amplifier 14 is also supplied to a high-pass filter 19, the output signal of which is supplied to a measuring instrument 20, which provides the measuring signal of the measuring device. Because the measuring system is stabilized by means of low-frequency signals, the measuring device shown in FIG. 1 is not suitable for measuring field variations with frequencies close to zero.

Figure 2:
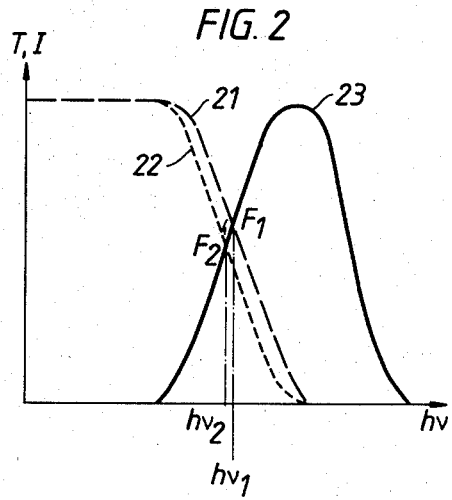
FIG. 2 is a graph which shows the mode of operation of the modulator.

The mode of operation of the field-sensitive modulator can be understood by reference to FIG. 2, which shows, in a long dash line, a transmission spectrum 21 for the modulator when this is subjected to a field F1, in a short dash line, a transmission spectrum 22 when the modulator is subjected to a different field F2, and in a full line, an emission spectrum 23 of the light source 1.

The modulator 5 in this case consists of a semiconductor having a band gap corresponding to $h\nu_1$, where h is Planck's constant and $\nu_1$ is the frequency of the light. When the field, which acts on the modulator, increases from F1 to F2, the band gap will decrease resulting in the transmission edge being displaced towards the left in FIG. 2 and the intersection with the spectral distribution curve 23 of the light source being displaced from $h\nu_1$ to $h\nu_2$, which means that a lower light intensity will be transmitted through the modulator 5. It should be noted that in order to obtain good stability, the light source should be temperature-stabilized.

Figure 3:
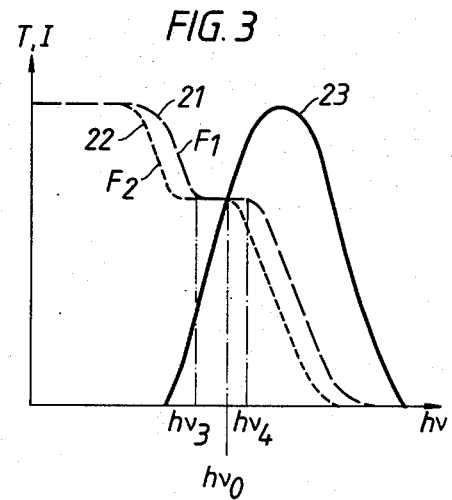
FIGS. 3–5 are further graphs which show the mode of operation of doped modulators.
Figure 4:
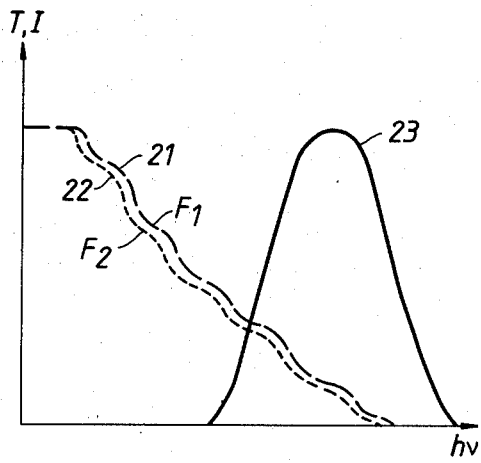
Figure 5:
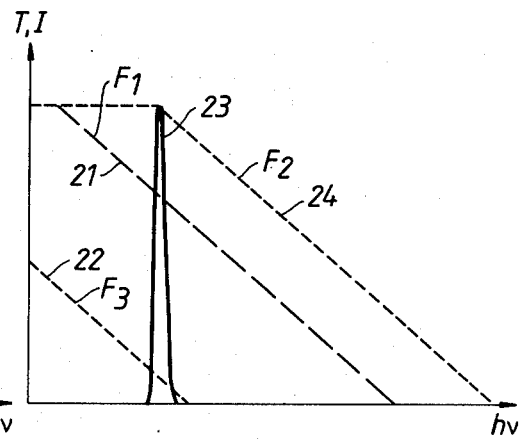

By doping the semiconductor in the modulator 5 so that a noise level is obtained in the band gap, a plateau can be obtained in the transmission spectrum between $h\nu_3$ and $h\nu_4$, which means that the transducer acquires a zone with a lower sensitivity. This is shown in FIG. 3 for the case where the field increases from F1 to F2, the intersection between the emission spectrum 23 of the light source and the transmission spectrum of the modulator thus being constant at $h\nu_0$. By appropriate doping of the semiconductor it is possible to obtain a modulator material having a transmission spectrum which changes substantially linearly with frequency over a considerable frequency range (as shown in FIG. 4). By doping the modulator with a number of impurities corresponding to different noise levels in the band gap and by controlling the concentrations of the dopants, a linear relationship may be obtained between the measured quantity and the light that is transmitted by the optical modulator. Because of the variations of the noise levels, the waved curve shape of the transmission spectrum according to FIG. 4 will be levelled out, even in the case of a few noise levels, into a substantially straight line, as is clear in exaggerated form from FIG. 5. If a narrow-band light source is used in this connection, a linear relationship may be obtained between the displacement of the absorption edge and the intensity of the light that has passed through the modulator.

Figure 6:
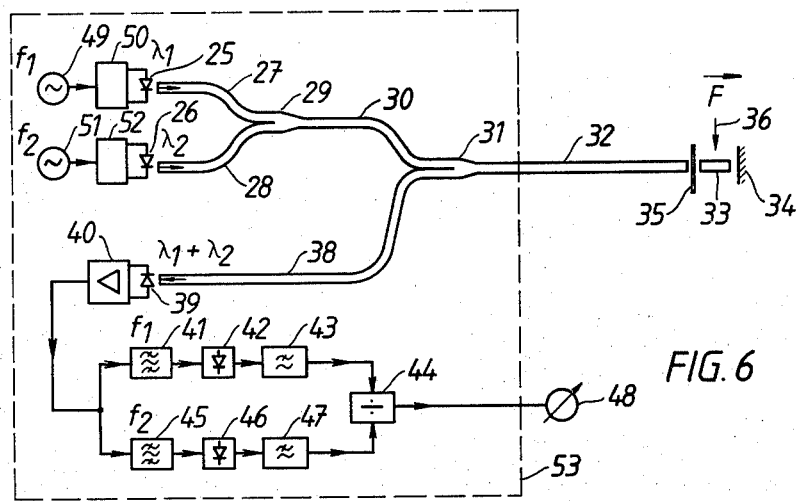
FIG. 6 shows a measuring device according to the invention for both static and dynamic measurements.

For measurements of slowly varying processes, the stabilizing method according to FIG. 1 cannot be used. FIG. 6 shows a measuring device suitable for such measurements. Two oscillators 49, 51, operating at different frequencies $f_1$, $f_2$, each control an LED 25 and 26, respectively, via two drive circuits 50 and 52, respectively, said LEDs transmitting light with different wavelengths $\lambda_1$ and $\lambda_2$, respectively, through one fiber each, 27 and 28, respectively. Downstream of a branch 29, the fibers 27 and 28 merge into a common fiber 30, so that two light components having different wavelengths and different modulating frequencies are passing along this fiber 30. These light components are led via a further branch 31 and a fiber 32 to a field-sensitive modulator 33 and, after a first transmission through the modulator, are reflected back to the fiber 32 by a mirror 34. Part of the light which passes into the fiber 32 after a double pass through the modulator enters a fiber 38 at the branch 31 and impinges upon a photon-detector 39, the output current of which is amplified in an amplifier 40. The output signal from the amplifier 40 is divided between two band pass filters 41, 45 into components which correspond respectively to the LEDs 25 and 26. These components, which have modulating frequencies of $f_1$ and $f_2$, respectively, are demodulated by rectifiers 42 and 46, respectively, and by low-pass filters 43 and 47, respectively. The signals thus obtained are supplied to a quotient-forming means 44, which produces at its output an electrical signal which is the quotient between the amplitudes of the two signals emanating from the modulator 33 which are respectively derived from the light sources 25 and 26. The value of this quotient will not be affected by instabilities in the fiber optics and is proportional to the transmission through the optical modulator 33 with respect to the light from the light source 25 and is the measured value of the measuring device, which value is supplied to an instrument 48, which may be, for example, a recording instrument. Further on in the description reference will be made to the electronics system and the fiber optics enclosed within the dash-lined square 53, will be described in greater detail hereafter.

FIG. 6 also shows an optical filter 35 adjacent to the modulator 33, this filter serving to transmit to the modulator the measuring signal (of wavelength $\lambda_1$) but to reflect the reference signal (of wavelength $\lambda_2$). Such a filter is not necessary, but results in a better separation between the measuring light and the reference light.

Figure 7:
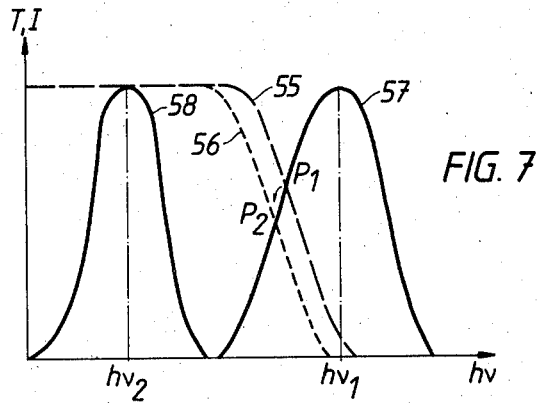
FIG. 7 is a graph illustrating the mode of operation of the measuring device according to FIG. 6, FIGS. 8, 9 and 9a show arrangements for increasing the field strength over a modulator.

The mode of operation of the light modulator 33 is clear from FIG. 7, in which the transmission curve of the modulator at the applied field of F1 is designated 55 and the corresponding curve for the greater field F2 has the designation 56. In the same way as has been explained in connection with FIG. 2, an alteration of the applied field F will lead to the point of intersection between the spectral curve 57 of the light source 25 and the transmission curve of the modulator being displaced. This results in the amplitude of the light of wavelength $\lambda_1$ and wave energy $h\nu_1$ from the light source 25 being altered by the change in the applied field.

To obtain a reference signal, the light of wave energy $h\nu_2$ from the light source 26 is chosen so that a spectral distribution according to curve 58 is obtained, which curve, within the range of fields in question, falls entirely to the left of the transmission edge 55/56 of the modulator. This means that the amplitude of the light component which is generated by the light source 26, although open to influence by varying transmission properties of the fiber optics, will not to any substantial extent be influenced by the varying transmission properties of the transducer caused by changes in the measuring signal. When using the filter 35 to prevent the light component from the source 26 from entering the modulator 33, the amplitude of the reference signal will be unaffected by changes in the field being measured irrespective of the relative locations of the curves 58 and 55/56.

In the measuring device shown in FIG. 6, the division into light wavelengths is carried out by a modulating frequency multiplexing of the two light sources 25 and 26, the two light components then being demultiplexed by the electric filters 41 and 45. Instead of frequency multiplexing, time multiplexing may be used, the light sources 25 and 26 then alternately receiving drive current. Further there is a possibility of using two detectors, each one being provided with an optical filter for optically filtering out the two light components.

Instead of using two different light sources, one single semiconductor laser may be used which is either wavelength-modulated or is driven alternately as an LED and as a laser.

For stabilizing the light sources, both optical and thermal control should be introduced. Optical control is suitably effected by coupling out part of the light, downstream of the branch 31, into a photon-detector, the output signal of which is compared, after amplification, with a reference signal to produce a comparison signal, which comparison signal is used to control the light source by means of a regulator. A further feedback may be introduced into the measuring device if the quotient-forming means 44 is omitted and the output signal from the filter 47, which is itself a reference signal from the transducer, after comparison with a suitable reference, is applied to a regulator for controlling the light sources in tandem or for controlling the amplifier 40. When several light detectors are included in the measuring device, it may be necessary to include a further regulating circuit for electronic match stabilizing.

Figure 8:
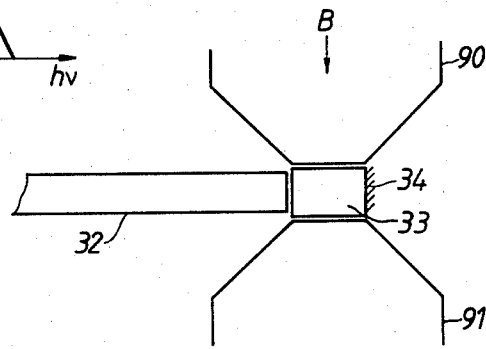
Figure 9:
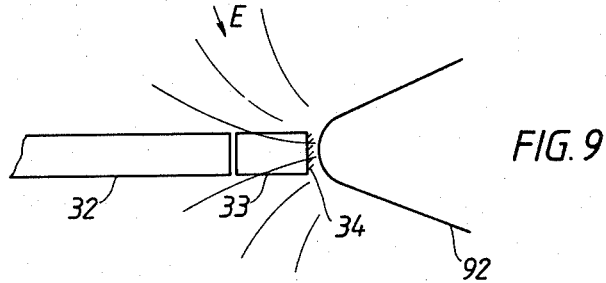

FIGS. 8 and 9 show arrangements for the concentration of a magnetic field (FIG. 8) and an electric field (FIG. 9) into the optical modulator 33. In the case of a magnetic field, said field is concentrated with the aid of yokes 90 and 91 of magnetic material, and in the case of an electric field, the corresponding concentration is carried out using an electrically conducting tip 92. The fiber 32 can be connected to the optoelectronic system shown in FIG. 1 or FIG. 6, depending on whether an a.c. field or a d.c. field is to be measured.

Figure 9A:
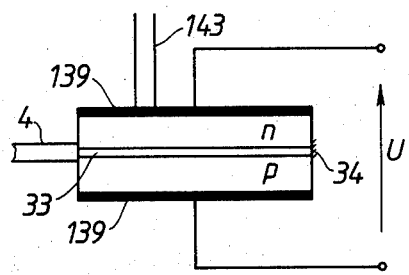

Another way of increasing the electric field strength is by utilizing the depletion layer of a PN-junction as the modulator in the manner shown in FIG. 9a. The electric field is generated by a voltage U, which is applied across a semiconducting PN-structure (diode) by means of electrodes 139. Light from the fiber 4 is led into the depletion layer 33, which acts as a wave guide and is reflected by the mirror 34 back into the fiber 4. In principle, a semiconductor laser structure may be used directly for this type of modulator.

The light may also be fed to the semiconductor in a direction perpendicular to the PN-junction via a fiber 143 in FIG. 9a. This assumes the use of a transparent electrode 139 or an electrode provided with a hole on the n-side of the diode. Finally, the p-layer in this case is designed so as to mainly consist of a space charge region. The latter condition may be fulfilled by a suitable combination of the thickness and resistivity of the p-layer.

Figures 10A, 10B:
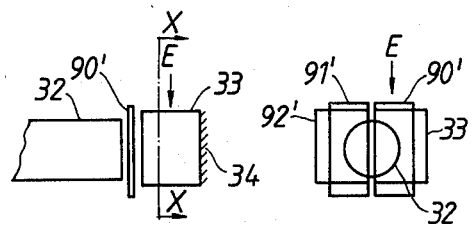
FIGS. 10a and 10b show a temperature-compensated transducer.
Figure 11:
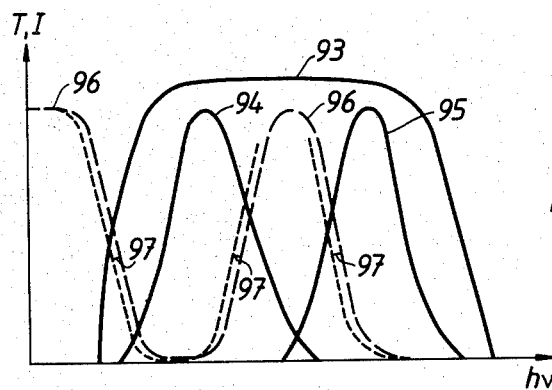
FIG. 11 is a graph explaining the mode of operation of the temperature-compensated transducer of FIGS. 10a and 10b, FIGS. 12a and 12b show a further temperature-compensated transducer.

A problem associated with the use of the field dependence of the band gap of the material is that the band gap is also temperature-dependent. If the transducer is to be used for measuring with high accuracy over a large temperature range, it is necessary that some form of temperature stabilization be carried out. FIGS. 10a and 10b (of which FIG. 10b is a section along the line x—x in FIG. 10a) show a transducer with an additional modulator 92', which is not affected by the field to be measured. As can be seen in FIG. 10b, light from the fiber 32 is divided into two parts, of which the right-hand part passes through a filter 90' and the modulator 33 affected by the field F, whereas the left-hand part passes through an identical arrangement with a filter 91' and the modulator 92' which is not affected by the measured magnitude. After reflection by the mirror 34, each of the two parts of the light returns through the respective modulator and filter and passes again into the fiber 32. The function of the transducer arrangement shown in FIGS. 10a and 10b is clear from FIG. 11, where the spectral distribution for the light which exits from the fiber 32 is designated 93, and in which 94 and 95 indicate, respectively, transmission spectra for the two filters 90' and 91'. The transmission spectrum for the modulators 33 and 92' is designated 96 and is shown as being identical for both. Upon an increase in temperature, the transmission curve 96 for the modulators will move to the left by the amount indicated at 97. This results in more light arriving at the fiber from that part of the transducer arrangement which has the filter 90' (curve 94), and in less light returning from that part of the transducer arrangement that has the filter 91' (curve 95). With suitable choice of filters and modulators, a temperature compensation may therefore be achieved. Instead of using a broad-band light source with the distribution curve 93, two narrow-band light sources may be used which have the distribution curves 94 and 95, respectively. Instead of one modulator functioning as a dummy modulator, it may be influenced by the field to be measured but acting on it in the opposite direction (i.e. with the opposite sign). In this way a doubling of the sensitivity may be obtained. The twin modulator shown in FIGS. 10a, 10b cannot be used directly with the electronic unit 53 of FIG. 6 since a quotient treatment of the light signals from the two modulators does not provide any stabilization. However, since an electronic summation does give the desired temperature stabilization, the quotient forming means 44 in the unit 53 can simply be replaced with a summation device.

Figures 12A, 12B:
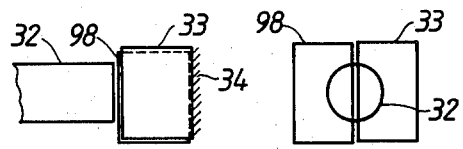
Figure 13:
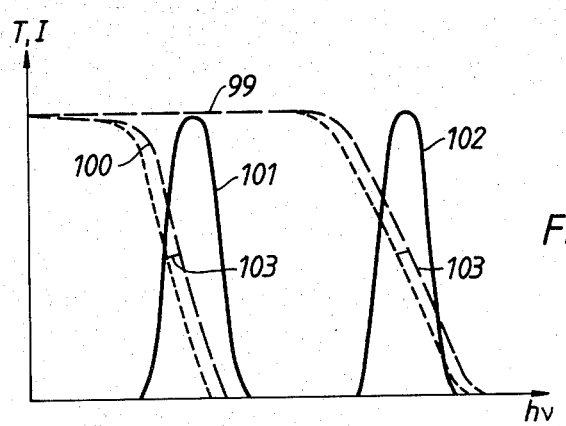
FIG. 13 is a graph explaining the mode of operation of the transducer of FIGS. 12a and 12b.

If two separate light sources are used, as shown in FIG. 6, a more simple transducer arrangement can, however, be used, such as that shown in FIGS. 12a and 12b. In this case, light from the fiber 32 is allowed to pass through a dummy modulator 98 (see FIG. 12a), which is not subjected to the influence of the field to be measured, and also through the field-influenced modulator 33. In FIG. 13 the function of such a transducer is explained. In FIG. 13, 99 and 100 indicate the transmission spectra for the measuring modulator and the dummy modulator, respectively, and 102 and 101 show the emission spectra of the measuring light and the reference light, respectively. When the transducer temperature increases, the absorption edges of the curves 99 and 100 will be moved to the left in FIG. 13, which results in a reduction of the intensity of the light transmitted by the modulations both with respect to the light from the light source corresponding to the curve 102 and from the light source with respect to the curve 101. Upon quotient formation, or different formation, of the two light components, which are reflected back into the fiber 32, the influence of the temperature change may be compensated for. Thus, a measuring device according to FIG. 6 may be used in this case, if the wavelength ranges of the light sources 25 and 26 are chosen so that they intersect the absorption edges of the two modulators in the manner shown in FIG. 13.

Figure 14:
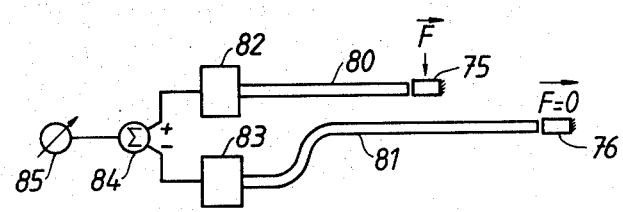
FIG. 14 shows a further temperature-compensated transducer.

FIG. 14 shows an alternative transducer also with temperature compensation. In this case the transducer is divided into two parts, with a measuring modulator 75 influenced by a field F and a dummy modulator 76 uninfluenced by the field F. The transmission through the two modulators is measured with two identical systems with light guides 80 and 81, respectively, and electronic units 82 and 83, respectively. The electronic units correspond to the dash-lined square 56 in FIG. 6 for measurement of d.c. fields. Light is conducted between the unit 82 and the modulator 75 in the fiber 80 and between the unit 83 and the modulator 76 in the fiber 81. The difference between the signals from the units 82 and 83 is determined in a subtracting means 84 and its output signal constitutes a temperature-compensated measuring signal which may be supplied to a registering instrument 85. In distinction to the arrangement shown in FIG. 13, modulators with the same band gap may be used in the arrangement of FIG. 14. An increase in temperature will involve a reduction of the transmission to the same extent in both modulators 75 and 76. The difference signal from the subtracting means 84 is therefore uninfluenced by the temperature change.

Instead of using a dummy modulator and a measuring modulator, two measuring modulators may be used, which presupposes that both modulators are influenced by the same magnitude of field but with the field acting in opposite directions in the two cases. This may result in a sensitivity which is twice as great.

Figure 15:
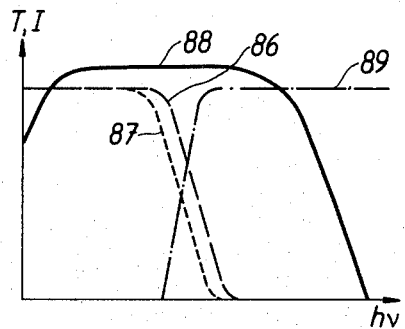
FIG. 15 is a graph explaining the mode of operation of a measuring device according to the invention when using a broad spectrum light source and optical filters.

FIG. 15 shows the mode of operation of a transducer for the case where a light source with a broad spectrum 88 is used. If the light source has a substantially constant intensity over a wavelength range which is greater than the wavelength range for the absorption edge 86 of the modulator, a linear relationship will be obtained between the displacement of the absorption edge and the light intensity of the light that has passed through the modulator. To obtain a linear relationship also between the magnitude to be measured and said light intensity, a suitably chosen light source, possibly combined with a filter, may be used. FIG. 15 shows also the characteristic 89 of a filter. With the transmission curve shown, a transducer with the same mode of operation as that shown in FIG. 2 will be obtained. The filter may be inserted into the ray path at any arbitrary position between the light source and the photon-detector in a measuring device according to FIG. 1 or FIG. 6. To achieve the situation as shown in FIG. 7, two filters may be used with transmission spectra according to the curves 57 and 58 in FIG. 7. There are in total four possibilities of influencing the spectral properties of the measuring device, namely by the choice of the light source, the filters in the ray path, the modulator and the photon-detector.

Figure 16A:
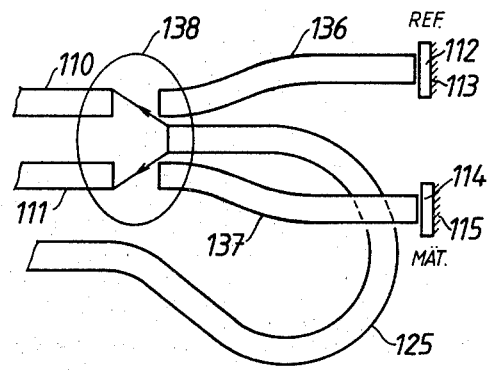
FIG. 16a shows a modified arrangement for the device of FIG. 16.
Figure 16:
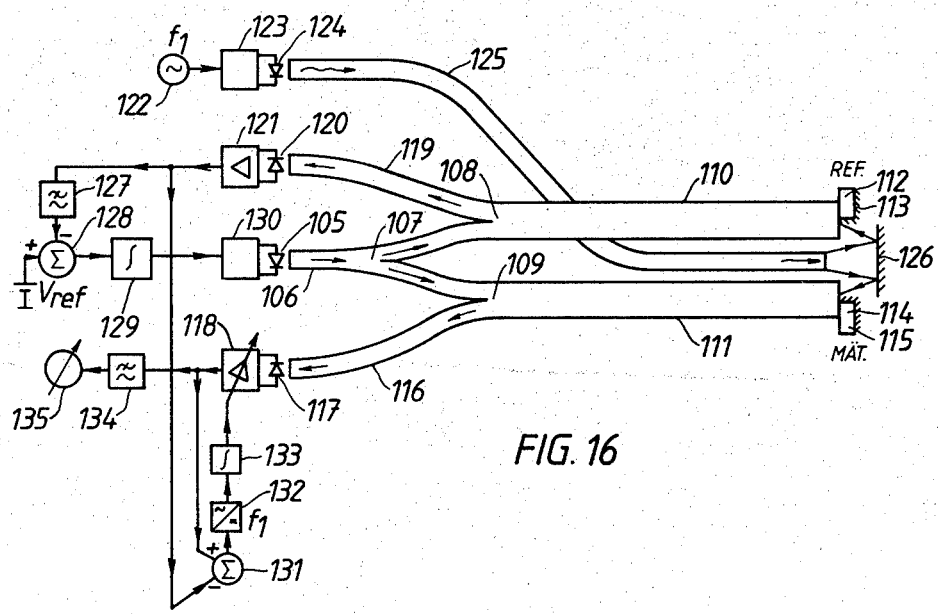
FIG. 16 shows a further measuring device according to the invention with a temperature-compensated fiber optic.

In addition to stabilizing the measuring device with the methods shown in FIG. 1 and FIG. 6, an optical fiber bridge arrangement according to FIG. 16 may be used. In that case at least three filters are required between the measuring electronics and the two optically bridge-connected modulators—one reference modulator and one measuring modulator—that are used to sense the magnitude to be measured. Light from a light source 105 is led via a fiber 106 to a branch 107, where the light is divided into branches 108 and 109 and into fibers 110 and 111, which lead the light to the reference modulator (112) and the measuring modulator (114), respectively. The modulators are provided with reflecting layers 113 and 115, respectively, which reflect the light back into the respective fibers 110 and 111. The reflected light is led via the branches 108 and 109, respectively, to fibers 119 and 116, respectively, and then to detectors 120 and 117, respectively. Primarily for match stabilization of the fibers 110 and 111 and the detectors 120 and 117, modulated light is transmitted from a light source 124 via a fiber 125 and a mirror 126 into the fibers 110 and 111 with a constant ratio. A modulating frequency $f_1$ for the source 124 is determined by an oscillator 122, which controls a drive circuit 123. True match stabilization is accomplished by generating a difference signal in a difference unit 131 from the output signals of detector amplifiers 121 and 118, the demodulation of this difference signal with respect to the frequency $f_1$ being effected in unit 132, and a regulator 133 being controlled with this demodulated difference signal such that the detector amplifier 118 is adjusted so as to obtain an $f_1$ component on the output of the amplifier 121 which is different from the $f_1$ component obtained on the output of the amplifier 118. The other stabilization of the measuring device and the compensation for any temperature drift of the measuring modulator are obtained through the feedback coupling via the reference modulator to the light source 105. The $f_1$ component on the output of the detector amplifier 121 is then filtered away by a low-pass filter 127, the output signal of which is compared with a reference voltage $V_{ref}$ in a difference-forming means 128. The signal thus obtained is used as an error signal to a regulator 129 which controls the light source 105 via its drive circuit 130 such that the output signal from the filter 127 is maintained equal to $V_{ref}$. The actual measuring signal is obtained after low-pass filtering of the detector signal from the magnitude to be measured and is supplied to a device 135.

Instead of using the mirror 126 for the feedback of light from the fiber 125 to the fibers 110 and 111, the arrangement according to FIG. 16a, with a separate coupling 138, may be used. The modulators 112, 114 may then completely cover the end surfaces of fibers 136 and 137 and there are no restrictions as far as the distance between the reference modulator and the measuring modulator is concerned. However, no match stabilization of the fibers 136 and 137 is obtained.

If the magnitude to be measured influences the two modulators with different signs and no reference modulator is used, twice the sensitivity of the measuring signal is obtained when the said signal is the difference between the detector signals associated with the two modulators. The stabilizing signal controlling the regulator 129 is then formed as the sum of the detector signals. If, instead, the magnitude to be measured influences the two modulators with the same signs, the sum of the detector signals is used as a measuring signal and the difference is used as a stabilizing signal. However, no temperature stabilization is obtained in this way unless the temperature sensitivities of the two detectors have different signs.

Instead of the stabilizing signal controlling the light source via the regulator 129, the stabilizing signal may control the detector amplifications in tandem. One further method of compensating the measuring signal for instabilities in the measuring device, is by carrying out a quotient formation between the measuring and stabilizing signals.

Further it should be mentioned that the branches 107, 108 and 109 may be omitted if the light from the light source 105 is led in a separate fibre to the modulators 112 and 114.

Figure 17:
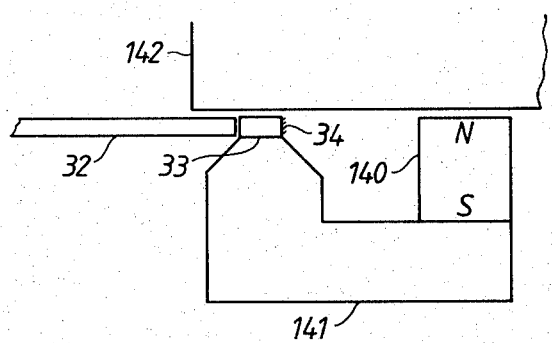
FIG. 17 shows a transducer of a measuring device in accordance with the invention used as a position detector.

Finally, FIG. 17 shows the use of a fiber optic magnetic-field detector 33 as a position transducer. A permanent magnet 140 gives rise to a magnetic flux in the magnetic circuit formed by poles 141 and 142, of magnetic material. The closer to the pole 142, the magnet 140 and/or the sensor 33 is/are located, the smaller will be the air gap in the magnetic circuit and the greater will be the magnetic field over the detector. The position transducer may be used, for example, for limit value indication and for sensing/measuring rotation of a toothed wheel.

The arrangements described above may be varied in many ways within the scope of the following claims.

What is claimed is:

1. An optical measuring device for measuring magnetic fields, comprising:
    at least one radiation modulator consisting of a material having spectral properties dependent on said field;
    means for measuring said spectral properties by radiation in a given wavelength range passing through said modulator, said modulator, in said given wavelength range, having at least one absorption edge in the absorption sprectrum of said material being modified by application of said field, said field dependence being caused by changes in the Landau levels in a magnetic field;
    at least one optical fiber for conducting light to and from the modulator; and
    said material having a specific resistivity at least as great as that of a semiconductor material.

2. An optical measuring device for measuring electrical fields, comprising:
    at least one radiation modulator consisting of a material having spectral properties dependent on said field;
    means for measuring said spectral properties by radiation in a given wavelength range passing through said modulator, said modulator, in said given wavelength range, having at least one absorption edge in the absorption spectrum of said material being modified by application of said field, said field dependence being caused by changes in the Franz-Keldysh effect of an electric field;
    at least one optical fiber for conducting light to and from the modulator; and
    said material having a specific resistivity at least as great as that of a semiconductor material.

3. A measuring device according to claim 1 or 2, including at least one source of light having an emission spectrum, in which the application of the field causes a displacement in an absorption edge of said material, said absorption edge occurring within the emission spectrum of the light from the said one source.

4. A measuring device according to claim 3, in which the material in the modulator includes a plurality of different materials to obtain a desired shape for the absorption edge of the material.

5. A measuring device according to claim 1 or 2, in which said means for measuring the absorption properties of said modulator measures the light absorption of said material in at least two different wavelength ranges, one wavelength range at least partially coinciding with the wavelength range of said one absorption edge of the material.

6. A measuring device according to claim 5, wherein said means for measuring includes a number of light-emitting devices, each light emitting device having different emission spectra.

7. A measuring device according to claim 5, wherein said means for measuring include at least two light-emitting devices, each provided with an optical fiber.

8. A measuring device according to claim 1 or 2, wherein said measuring device comprises at least one light source, at least one detector and at least two modulators, one of said modulators being influenced by the field to be measured, and another one of said modulators being influenced differently by the field to be measured and by the temperature, and means for compensating for the effect of the temperature on the modulators by a suitable processing of signals received from the two modulators.

9. A measuring device according to claim 8, further comprising means for measuring the light transmission in each of said at least two modulators in at least one wavelength range, and means for determining the difference of the transmission values measured.

10. A measuring device according to claim 8, in which means for measuring the light transmission in each of said modulators in at least one wavelength range is provided together with means for controlling at least one light source and/or at least one light detector to obtain said compensation.

11. A measuring device according to claim 1 or 2, further comprising a light source generating two components with different light spectra, the light spectrum for one component at least partially coinciding with an absorption edge of said modulator influenced by the field to be measured, and the light spectrum for the second component lying in a wavelength range in which the absorption edge for the measuring modulator is less influenced by the field to be measured.

12. A measuring device according to claim 11, in which said light source is temperature-stabilized.

13. A measuring device according to claim 1 or 2, in which a field concentrator is arranged adjacent to the modulator material for increasing the field strength in the material.

14. A measuring device according to claim 1, further comprising a magnetic circuit which includes an air gap of variable size and said modulator material is positioned in said magnetic circuit.

15. A measuring device according to claim 12, in which each light source, each light detector and each modulator included in the measuring device consists of a semiconductor selected from the group consisting of Ge, GaAs, GaP and AlAs.

16. A measuring device according to claim 2, in which the electric field is arranged to be applied across a PN-junction and the depletion region formed is used as the modulator.

17. A measuring device as in claim 1 or 2 in which said modulator material is polymeric.

18. A measuring device according to claim 1 or 2 in which said modulator material is polycrystalline or crystalline.

19. A measuring device as in claim 1 or 2 in which said modulator material is amorphous.

20. A measuring device according to claim 8 further comprising means for measuring the light transmission in each of said at least two modulators in at least one wavelength range, and means for determining the sum of the transmission values measured.

21. A measuring device according to claim 8 further comprising means for measuring the light transmission in each of said at least two modulators in at least one wavelength range, and means for determining the quotient between the transmission values measured.

22. A measuring device according to claim 8 wherein said at least two modulators are time-multiplexed with a constant ratio of light relative to the light modulated by said at least two modulators and further comprising light detectors responsive to the output of said at least two modulators so as to determine the difference between the signal outputs of the said at least two modulators to compensate for the effect of temperature on said at least two modulators.

23. A measuring device according to claim 8 wherein said at least two modulators are frequency-multiplexed with a constant ratio of light relative to the light modulated by said at least two modulators and further comprising light detectors responsive to the output of said at least two modulators so as to determine the difference between the signal outputs of the said at least two modulators to compensate for the effect of temperature on said at least two modulators.

24. A measuring device according to claim 5 wherein said means for measuring includes a wavelength-modulated laser for emitting light having at least two different emission spectra.

25. A measuring device according to claim 5 wherein said means for measuring includes a semiconductor laser alternately operated as a light-emitting diode and a laser.

* * * * *